(12) United States Patent
Lee et al.

(10) Patent No.: US 7,371,484 B2
(45) Date of Patent: May 13, 2008

(54) PHOTOMASK BLANK AND METHOD OF FABRICATING A PHOTOMASK FROM THE SAME

(75) Inventors: Jeong-yun Lee, Yongin-si (KR); Ka-soon Yim, Hwaseong-gun (KR); Jae-hee Hwang, Seongnam-si (KR); Il-yong Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 629 days.

(21) Appl. No.: 10/913,529

(22) Filed: Aug. 9, 2004

(65) Prior Publication Data

US 2005/0042526 A1 Feb. 24, 2005

(30) Foreign Application Priority Data

Aug. 18, 2003 (KR) .................. 10-2003-0056846

(51) Int. Cl.
*G03F 1/00* (2006.01)

(52) U.S. Cl. .......................................... 430/5
(58) Field of Classification Search .............. 430/5; 428/428, 430; 216/67, 48
See application file for complete search history.

(56) References Cited

U.S. PATENT DOCUMENTS

| 6,190,809 | B1 * | 2/2001 | Tzu et al. ................ 430/5 |
| 6,472,107 | B1 | 10/2002 | Chan |
| 6,544,696 | B2 | 4/2003 | Westerman et al. |
| 6,641,958 | B2 * | 11/2003 | Inazuki et al. ............... 430/5 |
| 7,011,910 | B2 * | 3/2006 | Shiota et al. ................ 430/5 |
| 2003/0013023 | A1 | 1/2003 | Chan |

FOREIGN PATENT DOCUMENTS

| KR | 1998-039477 | 8/1998 |
| KR | 1020010008631 A | 2/2001 |
| KR | 1020010018495 A | 3/2001 |

* cited by examiner

*Primary Examiner*—S. Rosasco
(74) *Attorney, Agent, or Firm*—Volentine & Whitt, PLLC

(57) ABSTRACT

A photomask blank includes a hard mask having an excellent etch selectivity with respect to an opaque layer. The photomask blank includes a light-transmissive substrate, an opaque chromium layer disposed on the light-transmissive substrate, and a hard mask layer disposed on the opaque chromium layer. The hard mask layer is of a conductive material having an etch selectivity of at least 3:1 with respect to the opaque chromium layer against an etch gas mixture including chlorine gas and oxygen gas. Also, a resist layer is disposed on the hard mask layer. Alternatively, a phase shift layer can be interposed between the light-transmissive substrate and the opaque chromium layer. Preferably, the hard mask layer is formed of Mo or MoSi. First, the resist layer is patterned, and the hard mask is etched using the patterned resist as an etch mask. Then the chromium layer is etched using the patterned hard mask as an etch mask.

30 Claims, 4 Drawing Sheets

PHOTOMASK BLANK AND METHOD OF FABRICATING A PHOTOMASK FROM THE SAME

BACKGROUND OF THE INVENTION

1. Field of the Invention

The present invention relates to a photomask. More particularly, the present invention relates to a mask blank and to a method of fabricating a photomask from the same.

2. Description of the Related Art

Photomasks are used to form fine patterns, which define a semiconductor circuit, in substrates and wafers of silicon or gallium arsenide (GaAs). The photomasks bear image patterns which are transcribed onto the substrate using an exposure process, and may be categorized as binary masks and phase shift masks (PSM). Each of these types of photomasks are manufactured from photomask blanks on which the image patterns have yet to have been formed.

A conventional binary photomask includes a transparent quartz substrate and an opaque pattern formed thereon. The opaque pattern is formed of a chromium layer and corresponds to the pattern of a semiconductor circuit to be formed on a substrate or wafer. Also, a chromium oxide layer is formed on the chromium layer as an anti-reflective layer (ARL). On the other hand, a conventional PSM includes a quartz substrate, a chromium layer disposed thereon, and phase shift material interposed between the quartz substrate and chromium layer. The phase shift material provides a phase shift effect in the PSM that allows for a higher resolution than the binary mask while using a conventional light source.

FIG. 1 is a sectional view of a photomask blank for use in manufacturing a conventional binary photomask. Referring to this figure, an opaque layer 16 and a photoresist layer 18 are sequentially formed on a light-transmissive substrate 12. The light-transmissive substrate 12 is a quartz substrate, and the opaque layer 16 is a layer of chromium.

FIGS. 2 through 4 illustrate a method of fabricating a photomask from the photomask blank shown in FIG. 1.

Referring first to FIG. 2, a photoresist pattern 18a is formed by etching the photoresist layer 18. More specifically, the photoresist layer 18 is etched by scanning an electron beam or a laser beam across the photomask blank in a raster fashion. The portions of the photoresist material exposed to the electron beam or the laser beam correspond to the circuit to be formed, and selected portions of the exposed layer of the photoresist layer 18 are removed by conventional methods.

Referring to FIG. 3, the opaque layer 16 is plasma dry etched using the photoresist pattern 18a as an etch mask to form an opaque layer pattern 16a. In general, the chromium layer and chromium oxide layer formed thereon are etched using a gaseous mixture of chlorine ($Cl_2$) and oxygen ($O_2$).

Referring to FIG. 4, the manufacturing of the photomask is completed by removing the photoresist pattern (18a) from the structure shown in FIG. 3.

The critical dimension (CD) of lines and spaces of the opaque layer pattern (16a) is measured. In this case, the measured CD refers to an average value of the CDs measured at several locations of the photomask. The average CD is compared to a predetermined target value. The photomask is considered to be acceptable when the average CD corresponds to or only deviates a small amount from the target value.

Also, nowadays, the design rule of the integrated circuits (ICs) of semiconductor devices is becoming smaller and smaller to meet the demand for more highly integrated semiconductor devices. A high degree of uniformity is required of the CDs of a photomask if the photomask is to be capable of being used to manufacture such highly integrated semiconductor devices. The range of the CDs (the minimum measured CD subtracted from the maximum measured CD) or the standard deviation of the measured group of CDs of a photomask is taken as a measure of the uniformity of the CDs.

In the conventional method of fabricating a photomask, $Cl_2$ and $O_2$ gases are used to etch the chromium layer and the chromium oxide layer, and the chromium layer and the chromium oxide layer generate $CrO_{2x}Cl_{2x}$ as a by-product. Note, the chromium layer and the chromium oxide layer cannot be etched using only $Cl_2$ gas or only $O_2$ gas. In addition, $Cl_2$ gas and $O_2$ gas readily react with carbon, which is a component of the photoresist. As a result, the photoresist layer is also etched in a reaction that produces CO or $CCl_4$. Also, when the chromium layer is etched using $Cl_2$ gas and $O_2$ gas, the etch selectivity between the chromium layer and the photoresist layer is less than about 2:1. Therefore, a thick photoresist layer should be used so that the selected portion of the chromium layer is etched away before the photoresist layer is etched away. However, a thick photoresist layer makes it difficult to control the loading effect and to effect a global uniformity, which are important aspects in the fabricating of a photomask. In addition, it is difficult to improve on making the actual (measured) CD correspond to the design CD because a thin photoresist layer cannot be used. In other words, the process margin is limited.

A hard mask pattern, instead of a photoresist pattern, has been proposed as an etching mask to improve the CD uniformity. Methods of using such a hard mask pattern are disclosed in U.S. Pat. No. 6,472,107 and US Patent Publication No. 2003/0013023. These disclosures teach a layer of silicon as being most preferable for use as a hard mask. In addition, the disclosures mention that Ti, TiW, W, TiN, $Si_3N_4$, $SiO_2$, or spin on glass (SOG) may also be used as the material of the hard mask.

However, Si, Ti, and W, and compounds thereof also readily react with $Cl_2$ gas and $O_2$ gas to produce $SiCl_4$, $TiCl_4$, $WCl_5$, or $WOCl_4$. That is, the etch selectivity between these hard mask materials and a chromium layer is very low. In addition, $Si_3N_4$, $SiO_2$, and SOG are non-conductive. Therefore, charges are not discharged from these materials when they are scanned with an electron beam. Accordingly, distortions occur in mask patterns made from $Si_3N_4$, $SiO_2$, or SOG. Furthermore, these materials are easily oxidized, are easily dissolved by an acid, an alkali, or a cleaning solution such as $H_2O$ or $H_2O_2$, and have poor etch selectivity in an etching process using $Cl_2$ gas or $O_2$ gas. By-products of the reaction between these materials and the etch gas have a boiling point that is below that of chromium. The layer exposed under the hard mask is damaged when the material of the hard mask is removed after the etching process. Additionally, these hard mask materials do not tolerate an organic stripper solution. Accordingly, the above-mentioned materials cannot serve satisfactorily as a hard mask in a process of etching a chromium and/or chromium oxide layer.

SUMMARY OF THE INVENTION

Therefore, an object of the present invention is to provide a mask blank having a hard mask that can serve as a satisfactory etch mask for a chromium layer.

Another object of the present invention is to provide a method of making a photomask having a patterned opaque chromium layer whose CDs are uniform.

Still another object of the present invention is to provide a method of making a photomask having a patterned layer whose average CD corresponds closely to the design CD.

According to an aspect of the present invention, there is provided a photomask blank comprising a chrome opaque layer formed on a light-transmissive substrate, a hard mask layer formed on the chrome opaque layer, and a resist layer formed on the hard mask layer. The hard mask layer is formed of a conductive material having an etch selectivity of at least 3:1 with respect to the chrome opaque layer against an etch gas including chlorine ($Cl_2$) and oxygen ($O_2$).

According to another aspect of the present invention, there is provided a photomask blank comprising a light-transmissive substrate, a phase shift layer disposed on the light-transmissive substrate, an opaque chromium layer disposed on the phase shift layer, a hard mask layer disposed on the opaque chromium layer, and a resist layer disposed on the hard mask layer. Again, the hard mask layer is of a conductive material having an etch selectivity of at least 3:1 with respect to the opaque chromium layer against a gaseous etchant including chlorine ($Cl_2$) and oxygen ($O_2$).

According to still another aspect of the present invention, there is provided a method of fabricating a photomask, such as a binary or phase shift mask, from the photomask blanks. In the method, a photoresist pattern is formed by removing portions of the resist layer. A hard mask pattern is formed by etching the hard mask layer using the photoresist pattern as an etch mask. The photoresist pattern is then removed and an opaque pattern is formed by etching the opaque chromium layer using the hard mask pattern as an etch mask. Then, the hard mask pattern is removed.

BRIEF DESCRIPTION OF THE DRAWINGS

The above and other aspects, features and advantages of the present invention will become more apparent by referring to the following detailed description of the preferred embodiments thereof made with reference to the accompanying drawings in which.

DETAILED DESCRIPTION OF THE PREFERRED EMBODIMENTS

Figure 1:
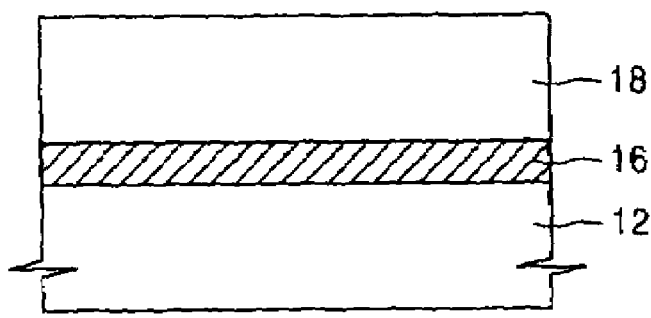
FIG. 1 is a sectional view of a conventional photomask blank.
Figure 2:
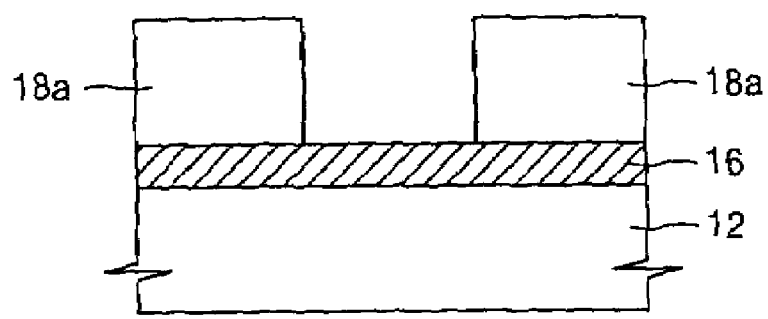
FIGS. 2 through 4 are sectional views illustrating a method of fabricating a photomask from the a conventional photomask blank of FIG. 1.
Figure 3:
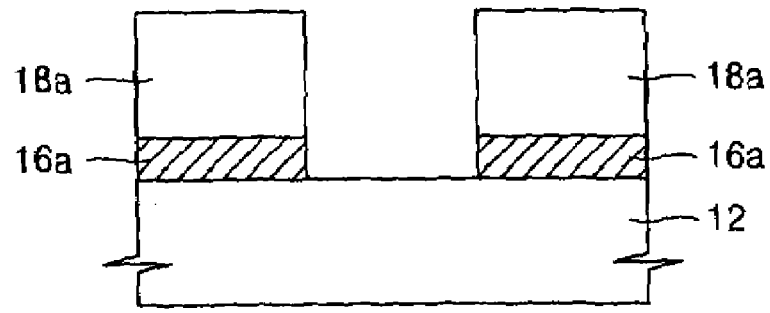
Figure 4:
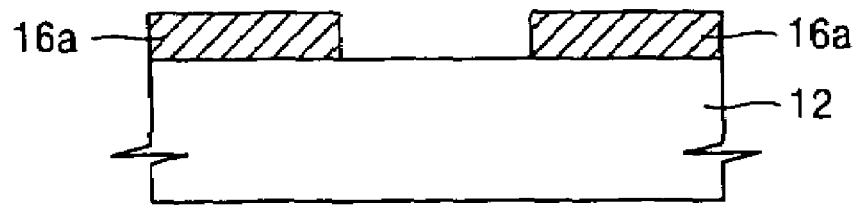

The present invention will now be described more fully with reference to the accompanying drawings. In the drawings, the sizes and the thickness of layers and regions are exaggerated for clarity. In addition, the same reference numerals are used to designate like elements throughout the drawings.

Figure 5:
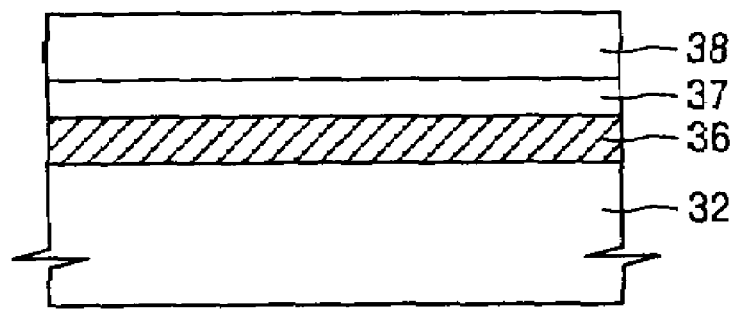
FIG. 5 is a sectional view of a first embodiment of a photomask blank according to the present invention.

Referring to FIG. 5, a first embodiment of a photomask blank according to the present invention is for use in the manufacturing of a binary photomask. The photomask blank comprises a light-transmissive substrate 32, and an opaque layer 36, a hard mask layer 37, and a resist layer 38 sequentially disposed on the light-transmissive substrate 32. The light-transmissive substrate 32 can be a 6×6 inch quartz substrate having a thickness of 25 mm. The opaque layer 36 can be a layer of chromium having a thickness of about 700 Å. Also, a chromium oxide layer (not shown) used as an anti-reflective layer (ARL) may be formed on the opaque layer 36.

Preferably, the hard mask layer 37 satisfies the following conditions in order to function satisfactorily as an etch mask for the opaque chromium layer 36.

First, the hard mask layer 37 should be conductive. The resist layer 38, which is the uppermost layer of the photomask blank, will be patterned by scanning an electron beam over the resist layer 38, and subsequently developing the exposed resist layer 38 to form a pattern corresponding to a pre-designed semiconductor circuit. In this case, a large number of charges accumulate on the surface of the hard mask layer 37 due to the electron beam. Accordingly, the hard mask layer 37 is formed of a conductive material that facilitates the discharging of the hard mask layer 37 so that the profile of the photoresist pattern is not distorted.

Second, the hard mask layer 37 should be oxidation resistant. If an oxide layer is formed on the exposed surface of the hard mask layer 37 after the hard mask layer 37 is etched, the critical dimension (CD) of the photomask may be altered. In this case, the chromium layer 36 cannot be precisely etched.

Third, the size of the particles constituting the hard mask layer 37 should be small. When the size of the particles of the hard mask material are too large, the sidewall profile of the hard mask pattern is not smooth. In that case, the desired pattern would not be transferred when the chromium layer 36 is etched using the hard mask pattern as an etch mask.

Fourth, the hard mask layer 37 should be insoluble with respect to an acid solution, an alkali solution, a cleaning solution of $H_2O$ or $H_2O_2$, and an organic stripper solution. If the hard mask material is easily dissolved by an acid solution or an alkali solution, which are used in a strip process and a cleaning process for removing the photoresist, a precise hard mask pattern cannot be formed.

Fifth, the etch selectivity of the hard mask layer 37 with respect to the opaque chromium layer 36 should be large. When the resist layer 38 is used as the etch mask, the resist layer 38 should be thick because the etch selectivity of the resist layer 38 with respect to the chromium opaque layer 36 is small, such as less than 2:1. Accordingly, the etch selectivity between the hard mask layer 37 and the opaque chromium layer 36 should be more than 3:1, preferably 5:1 to 25:1.

Sixth, the etch selectivity of the hard mask layer 37 with respect to the opaque chromium layer 36 against chlorine ($Cl_2$) gas and oxygen ($O_2$) gas should be large because the etchant for the chromium layer 36 is limited to a mixture of $Cl_2$ gas and $O_2$ gas.

Seventh, the by-product of the reaction between the hard mask layer 37 and $Cl_2$ and $O_2$ gases should have a high boiling point. The boiling point of the by-product of the opaque chromium layer 36 generated by the reaction with the mixture of $Cl_2$ gas and $O_2$ gas, which is $CrO_2Cl_2$, is about 117° C. Accordingly, the by-product of the reaction between the hard mask layer 37 and the mixture of $Cl_2$ and $O_2$ gases should be very high, i.e., should not be very volatile.

Eighth, the removing of the hard mask layer 37 after the opaque pattern is formed from the chromium layer 36 should not damage the exposed surface of the light-transmissive substrate 32. In other words, the hard mask layer 37 should be formed of a material that can be removed by an etch gas that does not react with quartz.

In the first embodiment of the present invention, the hard mask layer 37 is of Mo or MoSi to satisfy the above-described conditions. However, other materials including Mo, such as MoSiON, may also be used. Still further, Hf or a compound thereof, and Zr, Sn, Fe, NiSi, CoSi or compounds thereof can be used as the hard mask material.

Preferably, the thickness of the hard mask layer 37 is greater than about 30 Å while being less than the thickness of the opaque layer 36. When the thickness of the hard mask layer 37 is less than 30 Å, the hard mask layer 37 cannot serve as a satisfactory etch mask due to the etch selectivity between the hard mask layer 37 and the opaque chromium layer 36. When the thickness of the hard mask layer 37 is larger than the thickness of the opaque chromium layer 36, again, the hard mask layer 37 cannot serve as a satisfactory hard mask for the opaque chromium layer 36. On the other hand, the thickness of the resist layer 38 is preferably as small as possible in consideration of the thickness and the etch selectivity of the hard mask layer 37. In the first embodiment of the present invention, the thickness of the resist layer 38 is 100 to 4,000 Å, and preferably 3,000 to 4,000 Å.

Figure 6:
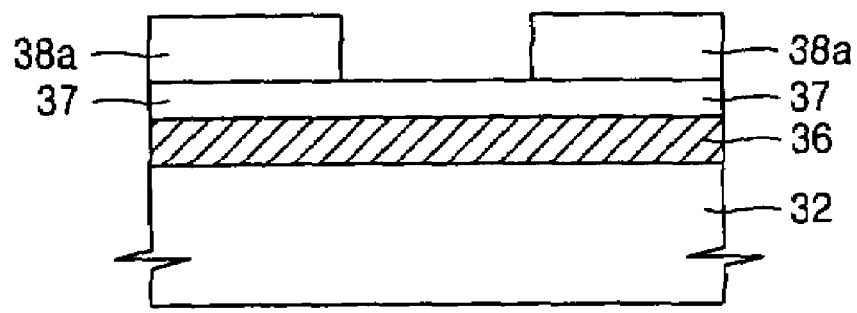
FIGS. 6 through 8 are sectional views illustrating a method of fabricating a photomask from the photomask blank of FIG. 5.
Figure 7:
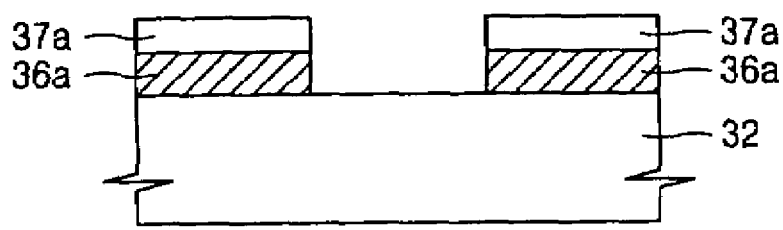
Figure 8:
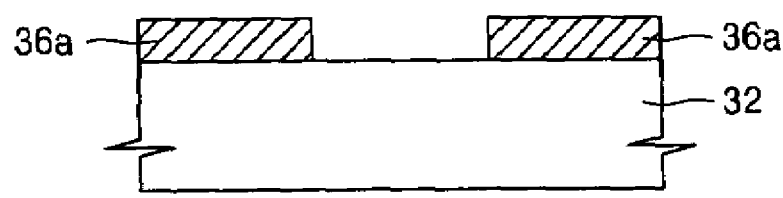

FIGS. 6 through 8 illustrate a method of fabricating a photomask from the photomask blank of FIG. 5.

Referring to FIG. 6, portions of the resist layer 38 are etched to form the photoresist pattern 38a, which corresponds to an image pattern to be realized on the photomask. The etching process comprises scanning an electron beam or laser beam across the blank in a raster fashion or a vector fashion using conventional exposure equipment. In this case, portions of the photoresist material are exposed by the electron beam or laser beam, whereupon the photoresist material is subsequently removed by a conventional method using a developing solution.

Referring to FIG. 7, the hard mask layer 37 is etched using the photoresist pattern 38a as an etch mask, thereby forming a hard mask pattern 37a. Subsequently, the opaque layer 36 is etched using the hard mask pattern 37a as an etch mask, thereby forming an opaque layer pattern 36a. In this case, various etch gases may be used to form the hard mask pattern 37a depending on the hard mask material. In the first embodiment of the present invention, when the hard mask layer 37 is formed of Mo, MoSi, or MoSiON, the hard mask layer 37 is etched by gas comprising a halogen such as F, Cl, Br, or 1. More specifically, when the hard mask layer 37 is formed of MoSi, the etch gas is selected from a group consisting of $CF_4$, $CF_4/O_2$, $CHF_3$, $CHF_3/O_2$, $SF_6$, $SF_6/O_2$, and $Cl_2$.

The opaque layer 36 is plasma dry-etched using a mixture of $Cl_2$ and $O_2$ gases and the hard mask pattern 37a as an etch mask to form the opaque chromium layer pattern 36a. An inert gas such as helium or argon may be added to the mixture of $Cl_2$ gas and $O_2$ gases. Here, the ratio of $Cl_2$ gas to $O_2$ gas is in the range of 2:1 to 10:1 depending on the desired etch selectivity. Also, the mixture of $Cl_2$ gas and $O_2$ gas is used to etch the chromium oxide layer (not shown) formed on the surface of the opaque chromium layer 36.

Referring to FIG. 8, the hard mask pattern 37a is removed using the etch gas.

Figure 9:
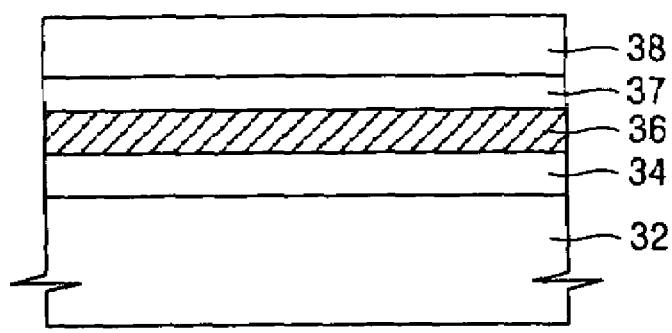
FIG. 9 is a sectional view of a second embodiment of a photomask blank according to the present invention.

FIG. 9 is a sectional view of a photomask blank for use in the manufacturing of a phase shift mask (PSM) according to the present invention.

Referring to FIG. 9, a phase shift layer 34 is interposed between the light-transmissive substrate 32 and the opaque layer 36. The phase shift layer 34 generates a phase shift effect and is formed of a MoSi-based material or a CrF-based material. The embodiment of FIG. 9 will be described in further detail with respect to a phase shift layer 34 comprising MoSi.

A hard mask layer 37 and a resist layer 38 are sequentially formed on the opaque layer 36. Here, the sizes and the characteristics of the layers are the same as described with reference to the embodiment of FIG. 5.

Figure 10:
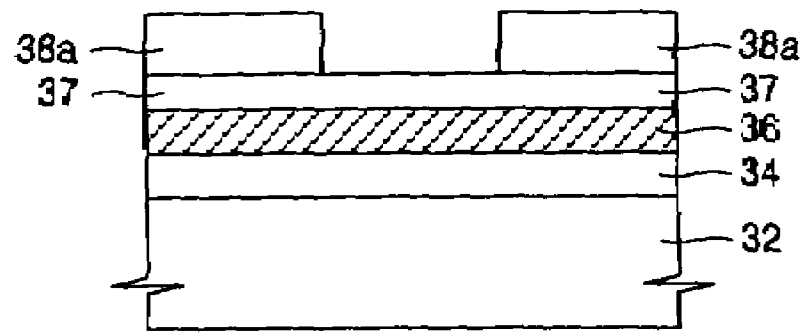
FIGS. 10 through 12 are sectional views illustrating a method of fabricating a photomask from the photomask blank of FIG. 9.
Figure 11:
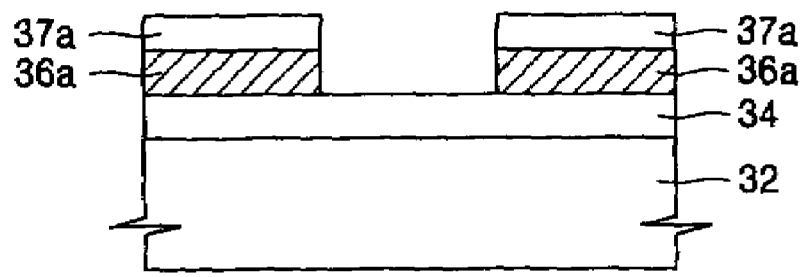
Figure 12:
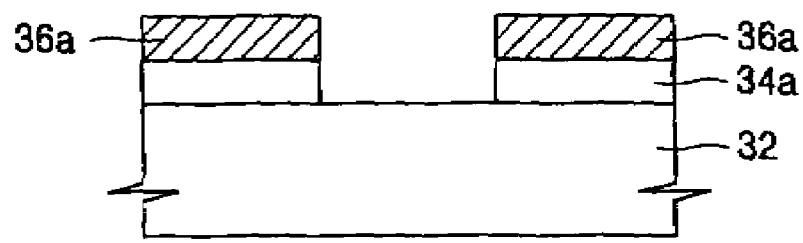

FIGS. 10 through 12 illustrate a method of fabricating a PSM from the photomask blank of FIG. 9.

Referring to FIG. 10, portions of the resist layer 38 are etched to form a photoresist pattern 38a corresponding to an image to be formed on the photomask. The photoresist pattern 38a is formed by scanning an electron beam or laser beam across the blank photomask in a raster fashion or a vector fashion using exposure equipment, as described above.

Referring to FIG. 11, the hard mask layer 37 is etched using the photoresist pattern 38a as an etch mask, thereby forming a hard mask pattern 37a. Then, the opaque layer 36 is etched using the hard mask pattern 37a as an etch mask, thereby forming an opaque layer pattern 36a. The details of the etching processes are the same as those described with reference to FIG. 7.

Referring to FIG. 12, the exposed portions of the phase shift layer 34 are etched using the hard mask pattern 37a and the opaque layer pattern 36a as an etch mask, thereby forming a phase shift layer 34a. The hard mask pattern 37a may be removed. Alternatively, the phase shift layer pattern 34a may be formed using the opaque layer pattern 36a as an etch mask after the hard mask pattern 37a is removed.

Depending on the hard mask material, the hard mask pattern 37a can also be removed while etching the phase shift layer 34. For example, when the phase shift layer 34 and the hard mask layer 37 are formed of MoSi, the exposed portions of the phase shift layer 34 and the hard mask layer 37 can be removed at the same time by the etch gas. When the phase shift layer 34 is formed of MoSi or MoSiON, the phase shift layer 34 is etched by using a gas comprising a halogen such as F, Cl, Br, and I. More specifically, the phase shift layer 34 is etched using a gas selected from a group consisting of $CF_4$, $CF_4/O_2$, $CHF_3$, $CHF_3/O_2$, $SF_6$, $SF_6/0_2$, and $Cl_2$.

In the present invention, a hard mask pattern instead of a photoresist pattern is used as the etch mask for forming the opaque layer pattern, so that a thin layer of photoresist can be used. Accordingly, the CDs of the hard mask pattern, to which the image of the thin photoresist pattern is transferred, are uniform.

The hard mask, which is used as the etch mask for the opaque chromium layer, has an excellent etch selectivity with respect to the chromium layer while having a smaller thickness than the chromium layer. Accordingly, the CDs of the opaque chromium layer pattern are uniform, a large process margin of the process of etching the chromium layer is provided, and the loading effect can be efficiently controlled. In addition, the linearity of the CD (correspondence between the actual and design CDs) is high because the hard mask layer has a low aspect ratio.

In addition, the method of fabricating the photomask blank according to the present invention does not produce much carbon in the etching chamber because the photoresist pattern is not used as an etch mask for etching the opaque chromium layer. In other words, the method according to the present invention is a relatively clean process.

Furthermore, a minimal amount of the ARL is corroded when the phase shift layer formed of MoSi is etched.

Finally, although the present invention has been particularly shown and described with reference to the preferred embodiments thereof, it will be understood by those skilled in the art that various changes in form and details may be made thereto without departing from the true spirit and scope of the invention as defined by the appended claims.

What is claimed is:

1. A photomask blank comprising:
    a light-transmissive substrate;
    an opaque chromium layer disposed on the light-transmissive substrate;
    a hard mask layer disposed on the opaque chromium; and
    a resist layer disposed on the hard mask layer such that the hard mask layer is interposed between the resist layer and the opaque chromium layer, wherein the resist layer can be patterned and the underlying hard mask layer can form an etch mask for the opaque chromium layer in a process of fabricating a photomask from the blank, and
    wherein the hard mask layer is of an electrically conductive material having an etch selectivity of at least 3:1 with respect to the opaque chromium layer against a gaseous etchant including chlorine ($Cl_2$) and oxygen ($O_2$).

2. The photomask blank of claim 1, and further comprising a chromium oxide layer disposed on the opaque chromium layer.

3. The photomask blank of claim 1, wherein the hard mask layer is of a material insoluble to an acid, an alkali, and a cleaning solution of $H_2O$, and a cleaning solution of $H_2O_2$.

4. The photomask blank of claim 1, wherein the hard mask layer is of a material selected from the group consisting of Mo, MoSi, and MoSiON.

5. The photomask blank of claim 1, wherein the hard mask layer is of Hf or a compound thereof.

6. The photomask blank of claim 1, wherein the hard mask layer is of a material selected from the group consisting of Zr, Sn, Fe, NiSi, CoSi, and compounds thereof.

7. The photomask blank of claim 1, wherein the thickness of the hard mask layer is greater than 30 Å and less than the thickness of the opaque chromium layer.

8. The photomask blank of claim 1, wherein the etch selectivity of the hard mask layer with respect to the opaque chromium layer is from 3:1 to 25:1.

9. The photomask blank of claim 1, wherein the thickness of the resist layer is from 100 to 4,000 Å.

10. A photomask blank comprising:
    a light-transmissive substrate;
    a phase shift layer disposed on the light-transmissive substrate;
    an opaque chromium layer disposed on the phase shift layer;
    a hard mask layer disposed on the opaque chromium layer; and
    a resist layer disposed on the hard mask layer such that the hard mask layer is interposed between the resist layer and the opaque chromium layer, wherein the resist layer can be patterned and the underlying hard mask layer can form an etch mask for the opaque chromium layer in a process of fabricating a photomask from the blank, and
    wherein the hard mask layer is of an electrically conductive material having an etch selectivity of at least 3:1 with respect to the opaque chromium layer against a gaseous etchant including $Cl_2$ and $O_2$.

11. The photomask blank of claim 10, and further comprising a chromium oxide layer interposed between the opaque chromium layer and the hard mask layer.

12. The photomask blank of claim 10, wherein the phase shift layer and the hard mask layer are of materials that can be etched using the same etch gas.

13. The photomask blank of claim 10, wherein the phase shift layer is of MoSi.

14. The photomask blank of claim 10, wherein the hard mask layer is of a material selected from the group consisting of Mo, MoSi, and MoSiON.

15. The photomask blank of claim 10, wherein the hard mask layer is of Hf or a compound thereof.

16. The photomask blank of claim 10, wherein the hard mask layer is of a material selected from the group consisting of Zr, Sn, Fe, NiSi, CoSi, and compounds thereof.

17. The photomask blank of claim 10, wherein the thickness of the hard mask layer is greater than 30 Å and less than the thickness of the opaque chromium layer.

18. The photomask blank of claim 10, wherein the etch selectivity of the hard mask layer with respect to the opaque chromium layer is from 3:1 to 25:1.

19. The photomask blank of claim 10, wherein the thickness of the resist layer is from 100 to 4,000 Å.

20. A method of fabricating a photomask, the method comprising:
    providing a mask blank comprising a light-transmissive substrate, an opaque chromium layer disposed on the light-transmissive substrate, a hard mask layer disposed on the opaque chromium layer, and a resist layer disposed on the hard mask layer such that the hard mask layer is interposed between the resist layer and the opaque chromium layer, wherein the hard mask layer is of an electrically conductive material having an etch selectivity of at least 3:1 with respect to the opaque chromium layer against a gaseous etchant including chlorine ($Cl_2$) and oxygen ($O_2$);
    exposing selected portions of the resist layer and removing portions of the resist layer to form a photoresist pattern;
    etching the hard mask layer using the photoresist pattern as an etch mask to form a hard mask pattern;
    subsequently removing the photoresist pattern;
    etching the opaque chromium layer using the hard mask pattern as an etch mask and a main etch gas mixture of $Cl_2$ and $O_2$ gases to form an opaque pattern; and
    removing the hard mask pattern.

21. The method of claim 20, wherein the hard mask layer is of a material selected from the group consisting of Mo, MoSi, and MoSiON, and said etching of the hard mask layer is performed using a gas comprising a halogen.

22. The method of claim 21, wherein the hard mask layer is etched using a main etch gas selected from the group consisting of $CF_4$, $CF_4/O_2$, $CHF_3$, $CHF_3/O_2$, $SF_6$, $SF_6/O_2$, and $Cl_2$.

23. The method of claim 20, wherein said etching of the opaque chromium layer is performed by controlling the ratio of the $Cl_2$ and $O_2$ gases of the main etch gas mixture to be within a range of 2:1 to 10:1.

24. A method of fabricating a phase shift mask, comprising:
    providing a photomask blank comprising a light-transmissive substrate, a phase shift layer disposed on the light-transmissive substrate, an opaque chromium layer disposed on the phase shift layer, a hard mask layer disposed on the opaque chromium layer, and a resist layer disposed on the hard mask layer such that the hard mask layer is interposed between the resist layer and the opaque chromium layer, wherein the hard mask layer is of an electrically conductive material having an etch selectivity of at least 3:1 with respect to the opaque chromium layer against a gaseous etchant including $Cl_2$ and $O_2$;

exposing selected portions of the resist layer and removing portions of the resist layer to form a photoresist pattern;

etching the hard mask layer using the photoresist pattern as an etch mask to form a hard mask pattern;

removing the photoresist pattern;

subsequently etching the opaque chromium layer using the hard mask pattern as an etch mask and a main etch gas mixture of $Cl_2$ and $O_2$ gases to form an opaque pattern.

25. The method of claim 24, wherein the hard mask layer is of a material selected from the group consisting of Mo, MoSi, and MoSiON, and said etching of the hard mask layer is performed using a gas comprising a halogen.

26. The method of claim 25, wherein the hard mask layer is etched using a main etch gas selected from the group consisting of $CF_4$, $CF_4/O_2$, $CHF_3$, $CHF_3/O_2$, $SF_6$, $SF_6/O_2$, and $Cl_2$ gases.

27. The method of claim 24, wherein said etching of the opaque chromium layer is performed by controlling the ratio of the $Cl_2$ and $O_2$ gases of the main etch gas mixture to be within a range of 2:1 to 10:1.

28. The method of claim 24, and further comprising etching the phase shift layer.

29. The method of claim 28, wherein the phase shift layer and the hard mask layer are of materials that can be etched by the same etch gas, and wherein said etching of the phase shift layer is performed using said same etch gas such that the hard mask pattern remaining on the opaque pattern is removed as the phase shift layer is etched.

30. The method of claim 28, and further comprising removing the hard mask pattern remaining on the opaque pattern before said etching of the phase shift layer is performed, wherein the phase shift layer is etched using the opaque pattern as an etch mask.

* * * * *